United States Patent [19]

Shaheen

[11] Patent Number: 4,740,414
[45] Date of Patent: Apr. 26, 1988

[54] CERAMIC/ORGANIC MULTILAYER INTERCONNECTION BOARD

[75] Inventor: Joseph M. Shaheen, La Habra, Calif.

[73] Assignee: Rockwell International Corporation, El Segundo, Calif.

[21] Appl. No.: 931,324

[22] Filed: Nov. 17, 1986

[51] Int. Cl.[4] .......................... B32B 3/00; B32B 15/00
[52] U.S. Cl. .................................... 428/210; 428/428; 428/432; 428/901; 156/89
[58] Field of Search ............... 428/210, 428, 432, 901, 428/698; 156/89; 501/11, 48, 6

[56] References Cited

U.S. PATENT DOCUMENTS

| | | | |
|---|---|---|---|
| 4,247,361 | 6/1979 | Shaheen | 156/630 |
| 4,299,873 | 11/1981 | Ogihara et al. | 428/137 |
| 4,338,380 | 7/1982 | Erickson et al. | 428/594 |
| 4,522,667 | 6/1985 | Hanson et al. | 156/87 |
| 4,556,598 | 12/1985 | Bloom et al. | 428/209 |
| 4,624,896 | 11/1986 | Watanabe et al. | 428/428 |

OTHER PUBLICATIONS

Computer-Generated Models Abridge Thermal Analysis of Packaged VLSI, Electronics, Feb. 10, 1982; pp. 145-148, Masood Murtuza.

Flexible Circuits Offer a Simple Solution to Chip-Carrier Mounting, Electronics, Feb. 23, 1984; pp. 149-151, Peter Kirby.

Thick-Film Multilayer Boards Resist Thermal and Mechanical Stress, Military/Space, Dec. 16, 1985; pp. 44J-44M, Han Danielsson.

Primary Examiner—John E. Kittle
Assistant Examiner—Patrick J. Ryan
Attorney, Agent, or Firm—H. Fredrick Hamann; George A. Montanye; Jonathan B. Orlick

[57] ABSTRACT

A multilayer board comprising a novel construction of ceramic and organic layers to reduce difficulties commonly encountered by board materials and components attached thereto having differing thermal coefficients of expansion. The multilayer board comprises an inorganic ceramic surface which is affixedly attached via a compliant adhesive to a conventional plated up post or plated thru hole organic multilayer board.

14 Claims, 1 Drawing Sheet

CERAMIC/ORGANIC MULTILAYER INTERCONNECTION BOARD

BACKGROUND OF THE INVENTION

1. Field of the Invention

The instant invention relates to ceramic/organic multilayer interconnection boards. More specifically, the invention relates to printed wiring boards that utilize a novel construction of ceramic and organic layers to reduce difficulties commonly encountered by board materials and components attached thereto having differing thermal coefficients of expansion.

2. Description of the Prior Art

Multilayer boards have been utilized as a convenient and low cost means for mounting and interconnecting discreet electrical components. More specifically, multilayer boards, formed of a dielectric substrate, are provided with conductive metallic pathways which define electrical connections between discreet components mounted thereon. The metallic leads of the components may be soldered to the conductive pathways to complete the desired electrical connections.

The dielectric substrate used to form the printed circuit board is generally glass fiber cloth which has been impregnated with a resin formulation, such as epoxy or polyimide. The thermal coefficient of expansion of the dielectric substrate is significantly greater than that of the discreet components. The dissimilarity between the thermal expansion coefficient has not presented an insurmountable problem heretofore, since the flexibility of the metallic leads of the discrete components would compensate for the thermal mismatch. Even in situations where the circuit assemblies are subjected to frequent and great thermal changes or excursions, a manufacturer can compensate for the thermal mismatch by providing a circuit layout design which incorporates expansion loops and the component leads to absorb the varied expansion and contractions of the elements thereby preventing stress on the solder joints which is a major cause of circuit failure.

Recently, manufacturers have developed components housed in leadless chip carriers. The leadless component carrier housings are generally formed from alumina, and are directly affixed to a circuit board or to a conductive layer of a multilayer board. It has been determined that the difference in thermal coefficient of expansion between the dielectric substrate and the alumina leadless chip carrier, has resulted in a high degree of solder joint (used for attachment to multilayer boards) failures. More exactly, the thermal coefficient of expansion for a conventional epoxy glass multilayer board is in the range of $15-20 \times 10^{-6}$ inch per inch per degree Celsius. In contrast, the alumina chip components have a much lower thermal coefficient of expansion, generally about $6.7 \times 10^{-6}$ inch per inch per degree Celsius. Thus, when a circuit board laminate having leadless components is subjected to high thermal excursions (for example, in ranges greater than $-55°$ C. to $+125°$ C.), solder joints between the components and the laminate frequently failed since there was no flexibility between the components and the laminate to compensate for the varying amounts of expansion. The failures encountered were typically in the form of cracks in the solder joints.

Therefore, it is apparent that it would be desirable to provide a multilayer board having a thermal coefficient expansion which more closely matches the thermal coefficient of expansion of the alumina chip components to prevent failures of the desired electrical connections. Furthermore, it would be desirable to provide a multilayer circuit board which continues to utilize the organic glass epoxy substrates for the circuit board construction since the latter offers considerable cost advantages and are relatively easy to manufacture.

In addition, to problems of mismatched coefficients of expansion there are also thermal dissipation problems associated with the use of leadless components. Integrated circuits embodied in leadless components will not last long nor operate properly if they overheat. The heat rails heretofore used on standard multilayer boards to eliminate overheating problems are not capable of being used with leadless components because the leads therein come out from all four sides of the chip carrier leaving no pathway on standard multilayer boards for conventional heat rails.

From the foregoing, the need should be appreciated for a new and improved multilayer circuit board having both a thermal coefficient of expansion and a thermal dissipation capacity which are particularly useful in conjunction with leadless components. Accordingly, a fuller understanding of the invention may be obtained by referring to the Summary of the Invention, and the Detailed Description of the Preferred Embodiment, in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises an improved multilayer board having a thermal coefficient of expansion which is particularly suitable for use in conjunction with leadless components. More specifically, a multilayer board is disclosed having a plurality of planar layers which are adhesively connected in a laminate structure via bonding layers formed of organic epoxy impregnated glass cloth.

In a preferred embodiment, the circuit board laminate of the subject invention includes an upper most planar ceramic alumina layer having a thermal coefficient of expansion less than the thermal coefficient of expansion that the composite laminate structure alone would have. An uppermost compliant adhesive layer is disposed directly beneath the ceramic uppermost layer and between a conventional printed circuit board layer. A lower most compliant adhesive layer, similar to the uppermost compliant adhesive layer, is disposed directly beneath the conventional printed circuit board layer and between a lower most ceramic alumina layer, similar to the uppermost ceramic alumina layer. Both the upper most and the lower most ceramic alumina layers are adapted to accept leadless alumina components. The resulting circuit board laminate has a thermal coefficient of expansion which is closely matched to the leadless component carriers to be attached thereto. Conventional heat rails are not required for thermal dissipation because the outermost alumina layers occupy 100% of the ceramic/organic multilayer interconnection board surface and acts as a relatively good thermal dissipator, thereby reducing the requirement for space consuming materials.

It is an object of the subject invention to provide a new and improved multilayer circuit board laminate having a thermal coefficient of expansion which is particularly useful in conjunction with leadless components.

It is another object of the subject invention to provide a multilayer circuit board laminate which can accommodate substantial thermal cycling.

It is still a further object of the subject invention to provide a multilayer circuit board laminate which is relatively inexpensive and easy to manufacture.

It is yet an additional object of the present invention to provide a multilayer circuit board laminate having improved heat dissipation properties.

Another object of the subject invention is to permit different components, modules and the like to be attached directly to the multilayer circuit board laminate surface.

Yet another object of the subject invention is to provide a multilayer circuit board laminate with thermal dissipation properties along with a structurally strong package that aids in dissipating thermal energy from directly attached semiconductors and other components.

It is an object of the subject invention to provide a multilayer circuit board laminate that can be easily and economically adapted for use with conventional multilayer boards without affecting the circuit density of said conventional multilayer boards.

The foregoing Summary of the Invention outlines some of the more pertinent objects and features of the invention. The objects should be construed to be merely illustrative of some of the more prominent features and applications of the intended invention. Many other beneficial results can be obtained by applying the disclosed invention in a different manner or modifying the invention within the scope of the disclosure. The summary outlines rather broadly the more pertinent and important features of the present invention in order that the Detailed Description of the Invention that follows may be better understood so that the present contribution to the art can be more fully appreciated.

Additional features of the invention will be described hereinafter which form the subject the claims of the invention. It should be appreciated by those skilled in the art that the conception of the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

Further objects and advantages of the present invention will become apparent as the following description of the preferred embodiment proceeds, taken in conjunction with the accompanying drawings in which.

Similar reference characters refer to similar parts throughout the drawings.

Figure 1:
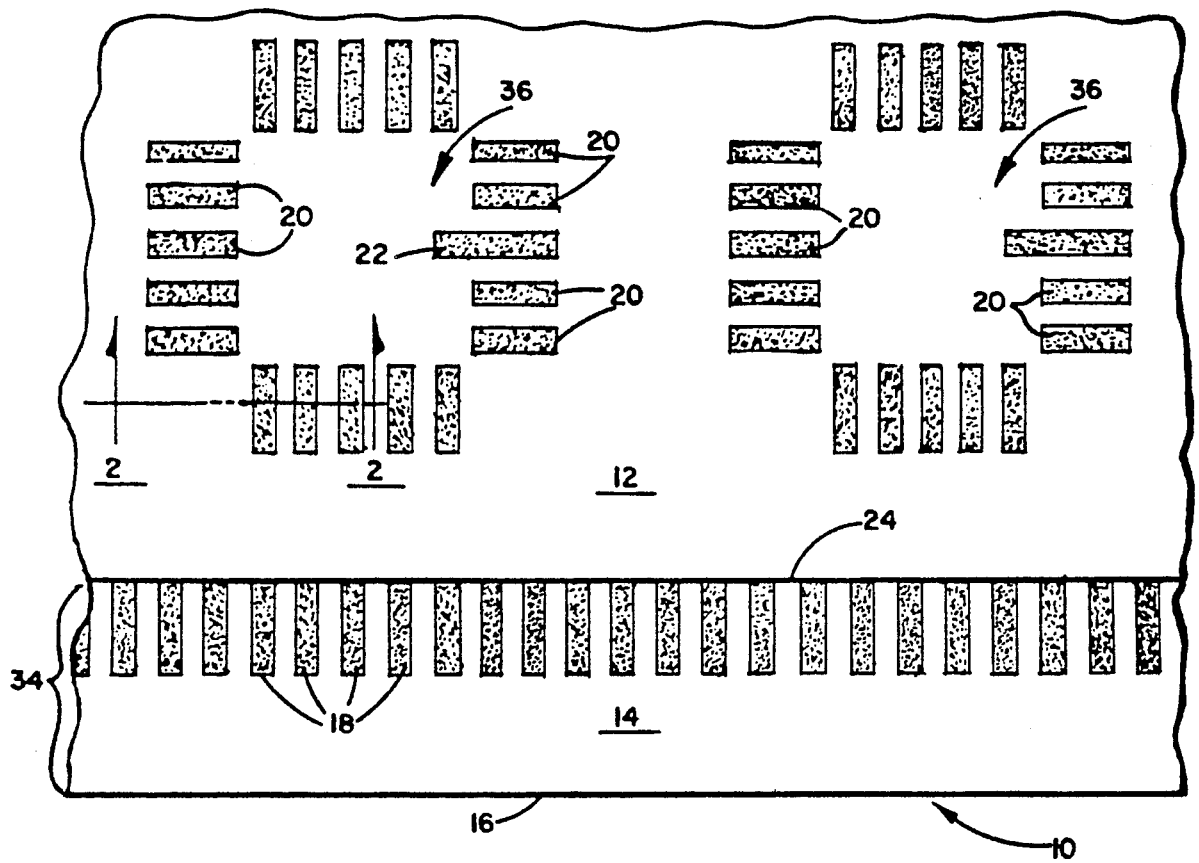
FIG. 1 is a top plan view of the ceramic/organic multilayer board.

Drawing reference numbers:
10  Ceramic/organic multilayer interconnection board
12  Upper most ceramic alumina layer
14  Conventional multilayer circuit board
16  Connector edge of 10
18  Connector contacts of 34
20  Electrically conductive footprints
22  Electrically conductive alignment footprint
24  Point of separation between 12 and 34
26  Uppermost compliant adhesive layer
28  Lower most compliant adhesive layer
30  Conventional multilayer board plated up posts
32  Lower most ceramic alumina layer
34  Edge card connector surface
36  Footprint pattern
38  Pads of 14

DETAILED DESCRIPTION OF THE PREFERRED EMBODIMENT

Figure 2:
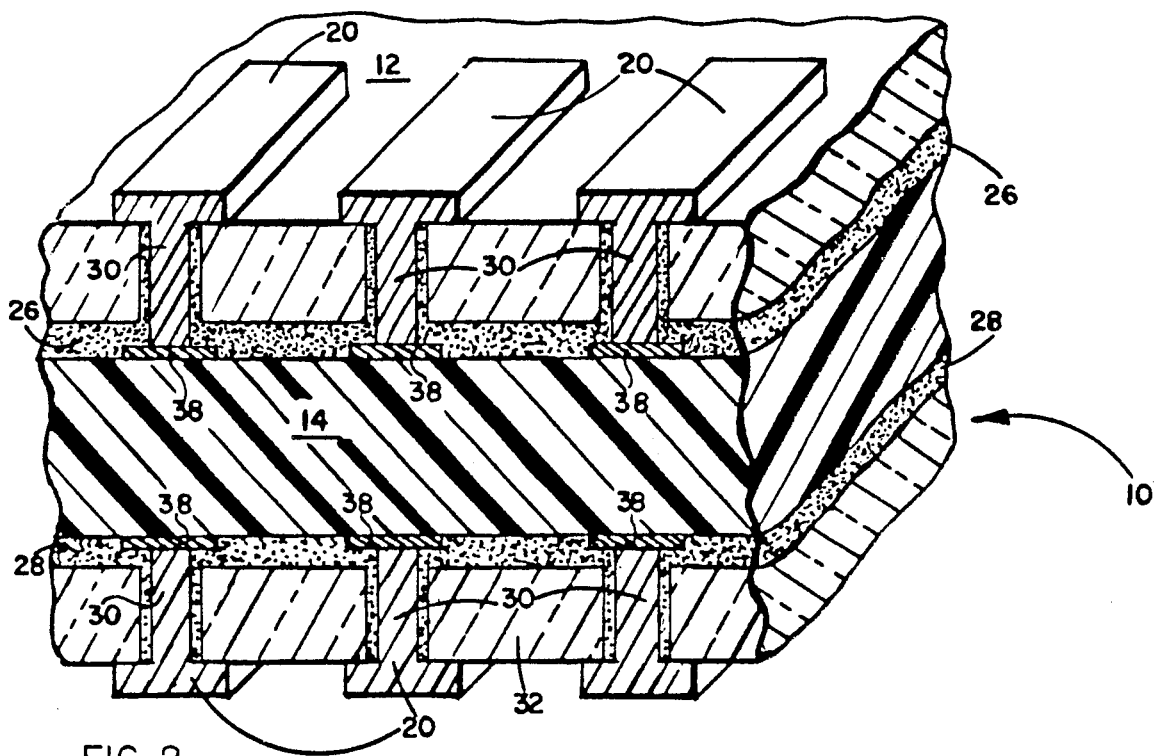
FIG. 2 is a perspective, partial section, partial elevational view taken along lines 2—2 of FIG. 1.

Referring now to the drawings, and particularly to FIGS. 1 and 2 thereof, there is shown a ceramic/organic multilayer interconnection board generally referred to by the reference numeral 10. More specifically, FIG. 2 illustrates a perspective, partial section, partial elevational view taken along lines 2—2 of FIG. 1. The ceramic/organic multilayer interconnection board 10 as depicted in FIG. 2 comprises an upper most ceramic alumina layer 12. An upper most compliant adhesive layer 26 is disposed directly beneath the upper most ceramic alumina layer 12 and between a conventional printed circuit board 14. A lower most compliant adhesive layer 28, similar to the upper most compliant adhesive layer 26, is disposed directly beneath the conventional printed circuit board 14 and between a lower most ceramic alumina layer 32, similar to the upper most ceramic alumina layer 12.

FIG. 2 also illustrates a plurality of conventional multilayer board plated up posts 30 which protrude through the respective upper most and lower most ceramic alumina layers 12 and 32 respectively, through the upper most and lower most compliant adhesive layers 26 and 28 respectively to the conventional multilayer board 14. The conventional multilayer board 14 is provided with a plurality of electrical conductive pathways (not shown) which define the circuit pathways to components mounted onto the electrically conductive footprints 20.

The conventional multilayer board 14 contemplated herein may be either a multilayer board having plated thru holes or a multilayer board having plated up posts. The materials used in the construction of these conventional multilayer boards that are particularly suitable for the application intended by the subject apparatus 10 are polyimide quartz teflon glass, epoxy glass and polyimide glass. These materials are typically preferred due to their desirable thermal coefficients of expansions with respect to alumina and for their thermal dissipation characteristics.

FIG. 1, a top plan view of the ceramic/organic multilayer interconnection board 10 illustrates a plurality of these electrically conductive footprints 20 which have been arranged in a footprint shape configuration 36 to accept the direct soldered connection of typical leadless components thereto. One of these footprints 22 is longer than the other conductive footprints 20 and serves to align the leadless components properly on the multilayer interconnection board 10. Since the leadless chip components are comprised from alumina and since the upper most layer of 12 of the ceramic/organic multilayer interconnection board is also comprised of alumina there is an near match between thermal coefficients of expansion. This match allows both the upper and lower most ceramic alumina layers 12 and 32 respectively to expand at approximately the same rate with the externally mounted leadless component carriers. This nearly equal rate of expansion maintains the integrity of the electrical connections between the leadless chip component carriers ano to the ceramic/organic multilayer board 10.

Referring again to FIG. 2, it can be seen that the upper most and lower most ceramic alumina layers 12 and 32 respectively have been bonded to the conventional multilayer circuit board 14 via compliant adhesive layers 26 and 28 respectively. This compliant adhesive preferably ranges in thickness between 0.002 and 0.006 inches thick and as such provides a cushioned effect to alleviate the thermal coefficient of expansion mismatch between the alumina overlays 12 and 32 and the organic material comprising the conventional multilayer circuit board 14. More particularly, during thermal cycling, any position movement that is different between the ceramic alumina layers 12 and 32 and that of the organic conventional multilayer circuit board 14, would be absorbed by the compliant adhesive layers 26 and 28 that separate the alumina layers 12 and 32 from the polyimide glass circuit board 14. In addition, the compliant adhesive comprising the compliant adhesive layers 26 and 28 respectively flows up and around the plated up posts 30, functioning to cushion the posts 30 from the effects of any movement of the ceramic alumina layers 12 and 32 respectively against the posts 30.

The composition of the upper most and lower most compliant adhesive layers 26 and 28 respectively is important. An adhesive material preferably having a low modulous of elasticity such as an epoxy nitrile or an acrylic adhesive modified for flexibility is desirable. It is also to be noted that a myriad of materials other than ceramic alumina may be used for the construction of the upper most and lower most ceramic alumina layers 12 and 32 respectively. For example, material such as mullite, beryllium, silicon nitride, silicon carbide, aluminum nitride or any combination thereof may be utilized and still be within the scope of subject matter contemplated by the instant invention. The actual selection of materials being dependent on the thermal dissipation required, cost of materials, ease of manufacture and adaptability to a particular purpose.

The conventional multilayer board plated up posts 30 are typically constructed from copper and as such are capable of taking shear stresses in the range between 22,000 to 28,000 pounds per square inch. The post's 30 high capacity for sheer stresses further serves to offset the stress supplied to the solder joints, which typically are only capable of withstanding shear stresses in the range of 4000 pounds per square inch.

A closer inspection of FIG. 1, further illustrates an edge card connector surface 34, comprising a conventional multilayer circuit board layer 14, having connector contacts 18. The edge card connector surface 34 is an extension of the conventional multilayer circuit board layer 14, but without the respective adhesive layers 26 and 28 (as shown in FIG. 2) and without the upper or lower most ceramic alumina layers 12 and 32 (32 shown in FIG. 2) respectively. The point of separation between the upper most ceramic alumina layer 12 and the edge card connector surface 34 is indicated by reference numeral 24. The point of separation between the lower most ceramic alumina layer 32 and the edge card connector surface 34 is not illustrated in the figures, but for purposes of completeness it is to be mentioned that the point of separation therebetween is identical to the depicted point of separation 24 between the upper most ceramic alumina 12 and the edge card connector surface 34. By cutting the ceramic alumina layers 12 and 32 short, i.e., to the point of separation 24 as indicated in FIG. 1, a thermal coefficient of expansion match can be obtained with connectors positioned on external multilayer boards. More specifically, the compliant adhesive layers 26 and 28 which function to separate the alumina layers 12 and 32 respectively IO from the conventional multilayer circuit board 14 are not available to offset any movement of the alumina ceramic layer 12 and 32 respectively against external connectors positioned on foreign multilayer boards. Accordingly, by cutting short the ceramic alumina layer 12, as shown in FIG. 1, the exposed material on the connector edge 34 typically has a thermal coefficient of expansion more similar to that of the connector on a foreign multilayer board. The matching of the thermal coefficient of expansions between adjacent multilayer boards enhances the connectivity of said boards during thermal excursions because they expand and contract at similar or nearly equal rates.

It is not to be inferred by the preceding description of the connector edge 34 that the subject invention is to be limited to this particular embodiment. For example, in certain instances it may be desirable to connect the ceramic/organic multilayer interconnection board 10 directly via soldered connections to devices and boards external to the apparatus 10. In these situations, there is no requirement of matching the varying thermal coefficient of expansions between adjacent boards or devices, thereby, the ceramic alumina layers 12 and 32 are not cut short and extend across the complete surfaces of the conventional multilayer board 14.

A number of methods, well known in the art may be utilized to accomplish the actual fabrication of the subject invention. A brief outline of one prefered method of fabrication begins with a completed conventional multilayer circuit board 14, upon which plated up posts interconnects are deposited onto pads 38 from the surface of the board 14 to another level which is the surface of the upper most ceramic alumina layer 12 and/or the lower most ceramic alumina layer 32 respectively. The conventional multilayer board 10 is cleaned. Next, electroless copper and electro-plated copper flash (thin copper) is deposited onto the upper most and lower most ceramic alumina layers 12 and 32, respectively, to provide a continuity between the copper traces (not shown) that reside on the board 14 surfaces. A film plating mask is then drilled which is utilized to subsequently plate the posts 30. The drilled film plating mask is then applied to the shorted out copper traces on the surfaces of the multilayer circuit board 14. Once this mask has been applied, the electrically conductive posts 30 are electro-plated up through the mask. The plated posts 30 protrude above the surface of the mask in a mushroom type fashion and are sanded down to be flush with the mask. The mask is then removed by simply peeling it away. The surface of conventional multilayer circuit board 14 is cleaned by conventional scrubbing methods and then the shorting copper flash is etched away.

The upper most and lower most ceramic alumina layers 12 and 32, respectively, are then laser drilled with holes to coincide with the posts 30 that have been plated on the surfaces of the multilayer board 10. Next, the drilled ceramic alumina is adhesively bonded to the surface of the conventional multilayer board 14 with the use of a compliant adhesive as discussed supra. This bonding results in the posts 30 protruding above the surfaces of the upper most and lower most ceramic alumina layers 12 and 32 respectively. The posts 30 are sanded down to be flush to the surfaces of the upper most and lower most ceramic layers 12 and 32 respectively. Metallization of the alumina occurs during the subsequent electroless copper operation discussed infra. (Alternatively, the ceramic alumina layers 12 and 32 may be metallized prior to being bonded to the multilayer board 10 when this is done the flush sanding of the posts 30 stops at the metallized surface of the ceramic alumina layers 12 and 32 respectively.) Additionally, any excess adhesive that may have run up on the upper or lower most surfaces 12 or 32 is removed during this step. Next, the interconnection of the conducting material that is on the ceramic alumina surfaces 12 and 32, respectively, to the posts 30 that protrude through the holes of the ceramic is accomplished by the use of well known electroless copper processes. The conductive footprints 20 are then photo patterned to produce the footprint pattern 36 which corresponds to the footprints of the leadless component carriers which will be subsequently assembled to the upper most and lower most ceramic alumina layers 12 and 32 respectively. After this photo patterning has been accomplished, the exposed footprint patterns 36 are then plated up to the required thickness (normally 0.0015 inches). The resultant footprint pattern 36 is shown in FIG. 1. This footprint pattern 36 is then solder coated and resist material is removed. The final step is the flash etching of the interconnecting copper between the individual footprints 20.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described, what is claimed is:

1. A ceramic/organic multilayer board functioning to reduce the thermal coefficient of expansion mismatches between component carriers mounted on said multilayer board comprising in combination:
   an organic inner layer having a top and bottom surface;
   a duality of compliant adhesive layers each respectively positioned on said top and said bottom surface; and
   a duality of inorganic ceramic layers each respectively affixed to said compliant adhesive layers.

2. The ceramic/organic multilayer board as set forth in claim 1, wherein said organic inner layer further comprises a plurality of electrically conductive pathways.

3. The ceramic/organ ic multilayer board as set forth in claim 1 wherein said compliant adhesive layers are selected from a group of materials, having good thermal conductivity and a low modulus of elasticity comprising epoxy nitrile or modified acrylic adhesive.

4. The ceramic/organic multilayer board as set forth in claim 1, wherein said inorganic ceramic layers are constructed from a group of materials comprising mullite, beryllium, silicon nitride, aluminum nitride and any combination thereof.

5. The ceramic/organic multilayer board as set forth in claim 2, wherein said ceramic layers further comprise electrically conductive footprints positioned thereon and being connected through said adhesive layers to said plurality of said electrically conductive pathways.

6. The ceramic/organic multilayer board as set forth in claim 1, wherein said ceramic layers are cut short to expose said organic inner layer for the direct electrical connection to foreign devices.

7. The ceramic/organic multilayer board as set forth in claim 2, wherein said inner layer's top and said bottom surfaces have conductive pads thereon electrically connected to said plurality of said electrically conductive pathways.

8. A ceramic/organic multilayer composite structure comprising in combination:
   a conventional organic multilayer board having a top side and a bottom side;
   an adhesive applied to said top and to said bottom side; and
   an inorganic ceramic layer affixed to said top and to said bottom side via said adhesive, said adhesive being disposed between said conventional multilayer board's top and bottom sides and between said inorganic ceramic layers.

9. The ceramic/organic multilayer composite structure as set forth in claim 8, wherein said ceramic/organic multilayer board has electrical connections selected from the group comprising plated thru holes, plated up posts, and a combination of both.

10. The ceramic/organic multilayer composite structure of claim 8, wherein said adhesive is selected from a group of materials having good thermal conductivity and a low modulus of elasticity comprising epoxy nitrile or modified acrylic adhesive.

11. The ceramic/organic multilayer board composite structure of claim 8, wherein said inorganic ceramic layers are constructed from a group of materials having a thermal coefficient of expansion similar to that of alumina comprising mullite, beryllium, silicon nitride, aluminum nitride and any combination thereof.

12. The ceramic/organic multilayer board composite structure as set forth in claim 11, wherein said ceramic layers further comprises electrically conductive footprints positioned on the surface of each said inorganic ceramic layer.

13. The ceramic/organic multilayer board composite structure as set forth in claim 12, wherein said electrically conductive footprints are connected through said adhesive to said multilayer board.

14. A multilayer board comprising in combination:
   an organic layer forming a printed circuit board;
   a compliant adhesive layer positioned on said organic layer; and
   an inorganic ceramic layer positioned atop said compliant adhesive layer.

* * * * *